United States Patent [19]
Nakanishi et al.

[11] Patent Number: 5,203,078
[45] Date of Patent: Apr. 20, 1993

[54] PRINTED WIRING BOARD FOR IC CARDS

[75] Inventors: Chiaki Nakanishi; Atsushi Hiroi; Yoji Yanagawa, all of Ogaki, Japan

[73] Assignee: Ibiden Co., Ltd., Ogaki,

[21] Appl. No.: 707,627

[22] Filed: May 30, 1991

Related U.S. Application Data

[60] Division of Ser. No. 554,086, Jul. 17, 1990, abandoned, which is a continuation of Ser. No. 26,670, May 26, 1987, abandoned.

[30] Foreign Application Priority Data

Jul. 17, 1985 [JP] Japan .................. 60-159192
Nov. 11, 1985 [JP] Japan .................. 60-253324

[51] Int. Cl.$^5$ ............................. H01R 9/06
[52] U.S. Cl. ........................ 29/843; 29/832; 29/841; 228/5.1; 361/398
[58] Field of Search ............... 29/832, 840, 841, 843; 357/72, 74; 361/398; 228/5.1

[56] References Cited

U.S. PATENT DOCUMENTS

| | | |
|---|---|---|
| 3,838,984 | 10/1974 | Crane et al. . |
| 4,222,516 | 9/1980 | Badet et al. .......... 228/5.1 X |
| 4,380,699 | 4/1983 | Monnier et al. . |
| 4,417,413 | 11/1983 | Hoppe et al. .......... 29/832 X |
| 4,447,716 | 5/1984 | Aigo . |
| 4,549,247 | 10/1985 | Hoppe et al. .......... 361/398 |
| 4,550,248 | 10/1985 | Hoppe et al. . |
| 4,725,924 | 2/1988 | Juan .................. 29/841 X |
| 4,727,246 | 2/1988 | Hara et al. .......... 361/398 X |
| 4,746,392 | 5/1988 | Hoppe ................ 29/841 X |
| 4,825,283 | 4/1989 | Shino ................ 357/72 X |
| 5,042,145 | 8/1991 | Boequet .............. 29/840 |
| 5,092,032 | 3/1992 | Marakami ............ 29/832 X |

FOREIGN PATENT DOCUMENTS

| | | |
|---|---|---|
| 57-210494 | 6/1981 | Japan . |
| 56-62337 | 6/1981 | Japan . |
| 58-27287 | 2/1983 | Japan . |
| 58-11198 | 7/1983 | Japan . |
| 58-134497 | 10/1983 | Japan . |
| 59-198792 | 1/1984 | Japan . |
| 59-229400 | 3/1984 | Japan . |

OTHER PUBLICATIONS

"Trend of Development of the Multifunctional Card System and New Application Field"—Japan Industrial Technical Center—Mar. 13–14, 1984.
"Identification Cards—Physical Characteristics", *International Standard* ISO-7810, First Ed. Dec. 15, 1985.
"Identification Card with an IC Chip and the Producing the Same", Unexamined Japanese Pat. Appln. No. 55-64148, Haghiri-Tehrani, Yahya, and Joachim Hoppe, Publ. No. 56-26451.

*Primary Examiner*—Carl J. Arbes
*Attorney, Agent, or Firm*—Lorusso & Loud

[57] ABSTRACT

This invention relates to a printed wiring board (10) for IC cards to be built in or fitted to a contact type IC card, that is, an IC card having external contact terminals. The present invention is to provide a printed wiring board (10) for IC cards wherein bumps (20) are formed in a part of a conductor circuit (13) of this printed wiring board (10) for IC cards and are made external contact terminals, futhermore wherein only the contact surfaces of the external contact terminals are exposed on the surface of the IC card (30) and the surfaces of the external contact terminals and the surface of an over sheet (14) are made to be on the same plane level, so that, in case the IC card (30) is bent, an IC module (12) may be perfectly prevented from springing out and further the electric contact reliability of the external contact terminal may be also high.

9 Claims, 8 Drawing Sheets

PRINTED WIRING BOARD FOR IC CARDS

This is a divisional of copending application Ser. No. 07/554,086, filed on Jul. 17, 1990, now abandoned, which is a file wrapper continuation of U.S. Ser. No. 026,670, filed on May 26, 1987, now abandoned.

BACKGROUND OF THE INVENTION

This invention relates to printed wiring boards to be built in or fitted to IC cards used as bank cards, identification cards, medical examination cards or the like. More particularly, this invention relates to a printed wiring board for IC cards having so-called IC chips processing and storing various information from a read-writer for IC cards and external contact terminals for transmitting and receiving by electric signals the above mentioned various informations for these IC chips.

Generally, the devices for transmitting and receiving information with the above mentioned read-writer for IC cards are largely divided into two types, a contact type transmitting and receiving electric signals through wires and a non-contact type using such wireless signals as electromagnetic wave, magnetic or optical signals on the way. The present invention relates particularly to the former.

The printed wiring board for IC cards of this type to be built in or fitted to an IC card has external contact terminals required to transmit and receive information from a read-writer for the IC card for the IC chips mounted on the board and a conductor circuit electrically connecting the external contact terminals with the IC chips or the like.

Before explaining the printed wiring board for IC cards according to the present invention, there shall be explained an IC module wherein IC chips or the like are mounted on a printed wiring board for IC cards and an IC card itself in which the IC module is built or fitted. For reliability and user convenience this kind of IC card is required to meet the following respective requirements:

(1) The IC card of this kind must be properly small and thin as a whole so as to be easily carried, controlled and inserted into the above read-writer for IC cards.

For this requirement, presently all IC cards are made about 0.76 mm thick so as to conform to the size of commonly used bank cards and the like. As the thickness of the IC chips arranged within the IC card is more than 0.25 mm at present, the thickness of the IC module except the external contact terminal is now more than 0.3 mm.

(2) The IC card of this kind must be electrically and frequently contacted with the read-writer for IC cards by the external contact terminals exposed on the surface and therefore the external contact terminals must be always high in the durability and electric contact in the operation.

(3) The IC card of this kind must be small and thin as explained in (1) above. In such case, the IC card will be likely to be curved during the use. Even in case the IC card is thus curved, the conductor circuit for the IC chips built in or fitted to the IC card must not be broken and the IC module provided with the IC chips must not be removed from the IC card.

(4) In the IC card of this kind, as described in (2) above, the external contact terminals are exposed but contact with water and dust which would adversely influence the IC chips must not easily enter the IC card.

The IC card of this kind is basically formed of a sheet-shaped card material which is a base material formed of such plastics as vinyl chloride and an IC module including IC chips and a printed wiring board. Particularly, in the case of a contact type IC card, the external contact terminals for transmitting and receiving electric signals must be exposed on the surface of the IC card as described above. The method of joining the sheet-shaped card material with the IC module to produce IC cards has progressed step by step and this historical development can be largely divided into three kinds as shown in the study "Trend of Development of the Multifunctional Card System and New Application Field" made by Japan Industrial Technical Center on Mar. 13 and 14, 1984 and in FIGS. 18 to 20 based on the same.

Figure 18:
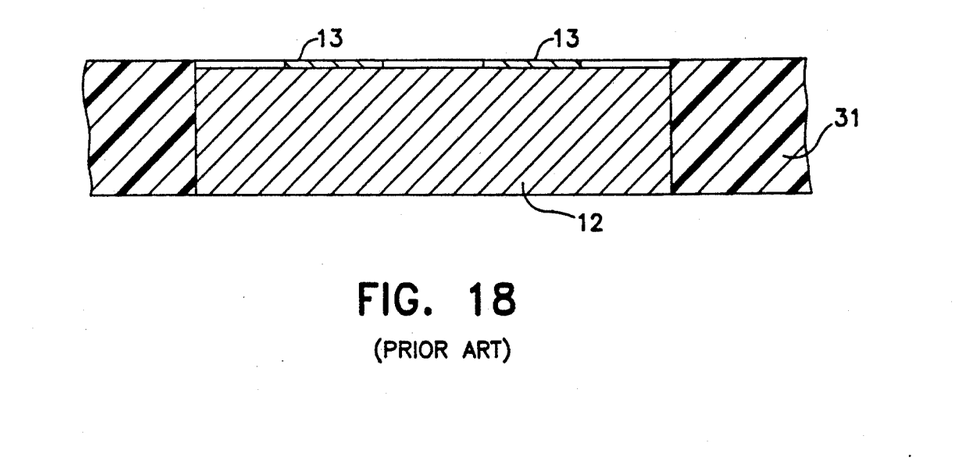
FIG. 18 is a partly magnified vertically sectioned view showing that an IC module is arranged in a hole formed in a sheet-shaped card material.
Figure 19:
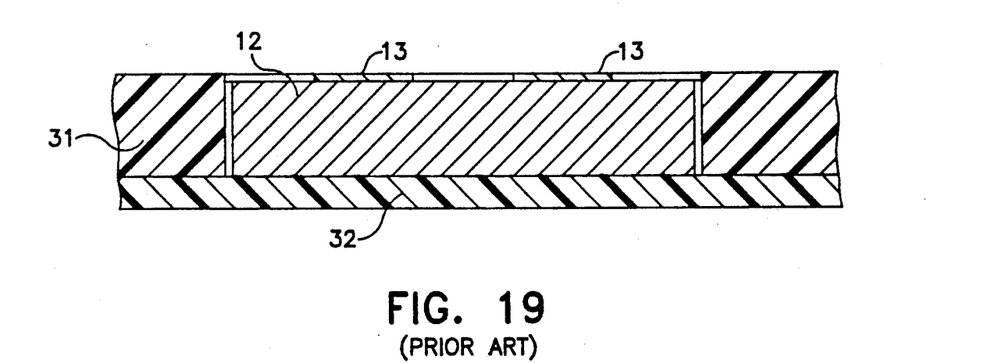
FIG. 19 is a partly magnified vertically sectioned view showing that an over sheet is bonded to the lower side of the arrangement shown in FIG. 18.
Figure 20:
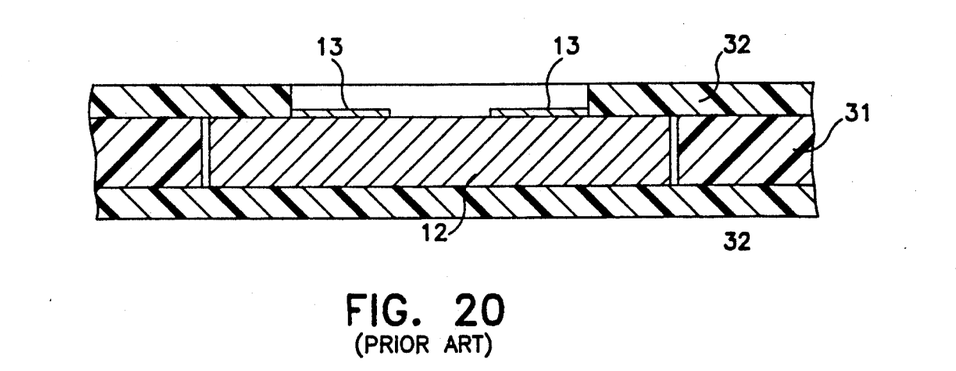
FIG. 20 is a partly magnified vertically sectioned view showing that an over sheet is bonded also to the upper side of the arrangement shown in FIG. 19.

FIGS. 18 to 20 show vertically sectioned views of the structures of IC cards joined by respective joining methods. The development steps of IC cards are shown in the order of these views.

FIG. 18 shows a partly magnified vertically sectioned view of an IC card wherein a predetermined through hole is formed in a sheet-shaped card material 31 and an IC module 12 is joined within this through hole and shows that the IC module 12 and the sheet-shaped card material 31 are joined with each other only on the side wall. Therefore, the IC card shown in FIG. 18 is likely to be simply removed from the sheet-shaped card material 31 and can satisfy the requirement of (1) above but can not satisfy the requirement of (3) above. The thickness of the IC card is less than 1 mm, accordingly, it does not hold together well and the practical range of use is narrow.

FIG. 19 shows a partly magnified vertically sectioned view of an IC card disclosed, for example, in the Unexamined Japanese Patent Publication laid open No. 210494/1982. In the IC card shown in this drawing, a recess is formed in the sheet-shaped card material 31 and an IC module 12 is fitted in this recess and is laminated on the underside with an over sheet 32. This IC module 12 is fitted in the recess of the sheet-shaped card material 31 so that the upper surface together with the external contact terminal (to which the conductor circuit 13 itself on the IC module 12 corresponds) formed on it may be exposed on the surface of the card. That is to say, it is disclosed in the above mentioned Unexamined Japanese Patent Publication laid open No. 210494/1982 that the IC module 12 is inserted and bonded in a recess formed in the sheet-shaped card material 31 by using a blade. However, the IC card of this type has a defect that, in case the card is bent so as to be convex upward, the IC module 12 will spring out and can not satisfy the requirement of (3) above.

FIG. 20 shows a partly magnified vertically sectioned view of an IC card disclosed, for example, in the Unexamined Japanese Patent Publication laid open No. 26541/1981. The IC card shown in this drawing shall be temporarily called a "laminated type". In this laminated type IC card, over sheets 32 are bonded on both upper and lower surfaces of the IC module 12 and an aperture is formed in the upper side over sheet 32 to expose the conductor circuit 13 to be an external contact terminal part. It is disclosed in the above mentioned Unexamined Japanese Patent publication laid open No. 26541/1981 that, in the IC card shown in FIG. 20, the over sheet 32 in which only the part corresponding to the external contact terminal is cut off is bonded on the IC module 12. The IC card shown in the Unexamined Japanese Patent Publication laid open No. 26541/1981 can satisfy the requirement of (3) above to some extent but is not satisfactory for the following reasons.

In order to prevent the IC module 12 from springing out the IC card is bent, in case the thickness of the over sheet must be at least 0.1 mm and, if possible, more than 0.15 mm when the oversheet 32 is made of the typically used vinyl chloride. This conclusion is supported by the bending standard test in the interim report of "ISO/TC 97/SC 17 Identification and Credit Cards" June, 1984. As the thickness of the over sheet 32 used for this IC card must be more than 0.1 mm, the thickness of the external contact terminal of the IC module 12 coated with this over sheet 32 must be at least 0.1 mm. Unless the external contact terminal is of such thickness, the external contact terminal part will be positioned below the surface of the IC card by the thickness of the over sheet 32, therefore the problem of dust accumulating in the recess formed thereby will occur as the IC card is used and the electric contact reliability of the external contact terminal will become very low.

As described above, in order to satisfy the requirements of (1) to (4) above in the IC card, the amount of the projection from the IC module 12 surface of the external contact terminal formed on the IC module 12 must be more than is predetermined (at least 0.1 mm). In other words, in the printed wiring board for IC cards according to the present invention, the amount of the projection of the external contact terminal is required to be at least 0.1 mm.

Also, as described above, the total thickness allowable in this kind of IC card is 0.76 mm. As the thickness of the IC chip is usually more than 0.25 mm, the thickness of the IC module 12 less the external contact terminal is required to be more than 0.3 mm. Therefore, in the IC card of the type laminated with the over sheets 32 on both surfaces, the thickness of the over sheets 32 on the front and back is less than 0.46 mm. Furthermore, the over sheets 32 on the front and back may be substantially of the same thickness in order to prevent warping. Therefore, the thickness of the over sheet 32 on the external contact terminal side is less than 0.23 mm. The thickness of the external contact terminal corresponding to it may be likewise less than 0.23 mm. However, in case this external contact terminal and the conductor curcuit 13 are simultaneously formed, in consideration of the fact that the thickness of the conductor circuit 13 which must be laminated with the over sheet 32 so as not to protrude is 0.025 to 0.07 mm, the thickness of the external contact terminal must be about 0.3 mm.

The question of increasing the thickness of the external contact terminal in IC cards of this type is not addressed in the above mentioned respective data and in the data related to the field.

The Unexamined Japanese Patent Publication laid open No. 26451/1981 (filed on May 17, 1979 by claiming priority based on West German Application No. P2920012.2 and laid open in Japan on Mar. 14, 1981), discloses an identification card wherein IC chips for processing electric signals are provided and are fitted to separate supporting members inserted in a window, characterized in that the thickness of said supporting member is made substantially equal to that of the identification card, said IC chips are arranged within said supporting members, the shape of said window is made similar to the shape of said supporting member, said window is made larger than said supporting member so that said supporting member may be enclosed with a gap and said supporting member is supported within said window by a basically elastic coupling member.

Particularly in FIG. 2 of this technical data is mentioned "contact surface 20" thought to correspond to the external contact terminal at issue in the present invention. However, the necessity for and formation of this "contact surface 20" are never thoroughly addressed.

Further, in the Unexamined Japanese Patent Publication Laid open No. 229400/1984 (laid open in Japan on Dec. 22, 1984) is mentioned an IC card wherein IC chips are fitted to a base and an electroconductive layer is provided at least around the IC chips. Particularly in FIGS. 2 and 4 to 7 thereof is mentioned "external terminal 6" thought to correspond to the external contact terminal at issue in the present invention. However, the necessity for structural feature and formation of this "external terminal 6" are not in this data.

As in the above, in the Unexamined Japanese Patent Publication laid open No. 26451/1981 and 229400/1984, the necessity for structural feature and formation of each of the "contact surface 20" and "external terminal 6" thought to correspond to the external contact terminal at issue in the present invention are not disclosed because it was very difficult with the technique in those days to form it so as to satisfy the above described limitation relating to thickness and the like. Particularly, using the general technique in those days that such external contact terminal is formed simultaneously with the other conductor circuit 13 on the surface of the IC module 12, it was very difficult to form the external contact terminal having a predetermined thickness. Therefore, the formation of the external contact terminal of the type at issue in the present invention could not be disclosed at all in the above mentioned Patent Gazette.

Figure 21:
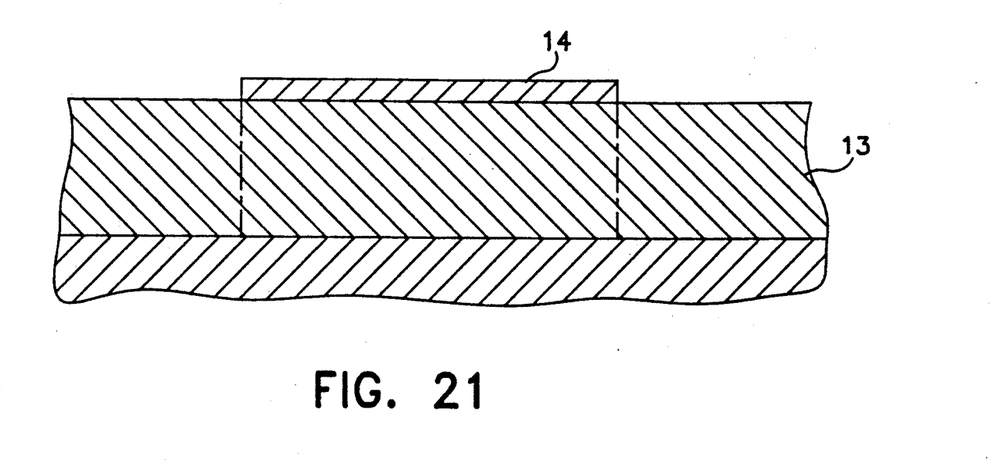
FIGS. 21 and 22 are respectively partly magnified vertically sectioned views for explaining the problem in the case of forming an external contact terminal by an etching method.
Figure 22:
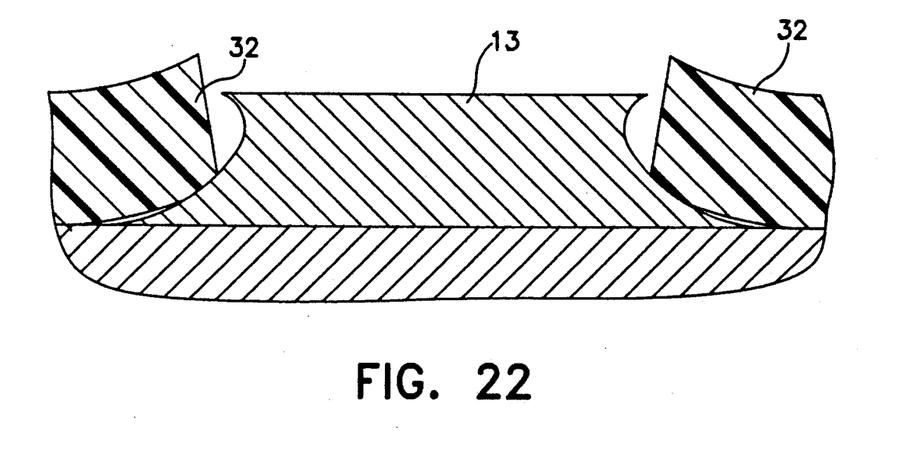

The formation of the external contact terminal using this conventional technique as considered on the basis of the conventional technical level known to the inventors is as follows. The conductor circuit 13 and external contact terminal are formed on the surface of the IC module 12 usually by etching the conductor foil on the IC module 12. As shown in FIG. 21, an etching mask 14 is applied to the conductor foil surface on the surface of the IC module and the range shown by the two-point chain lines is left through this etching mask 14. However, it is very difficult to etch this conductor foil on the lines at right angles with the etching mask 14. As shown in FIG. 22, the side of the conductor circuit 13 or external contact terminal formed by etching is not etched at right angles but is curved by the impregnation with the etching liquid. With such shape, the side of the conductor circuit 13 or external contact terminal will be deformed. If the external contact terminal is to be laminated with the over sheet 32 so as to expose the surface, the end part of the over sheet 32 will ride on a part of the side of the external contact terminal and, as shown in FIG. 22, the external contact terminal will not be able to be actually laminated with the over sheet 32 so as to be flush with the surface of the external contact terminal.

This shall be described in more detail. In the case of etching a metal such as a copper foil, the etching factor will be about 2. Therefore, the side of the external contact terminal will not be at right angles but can be a slope at an angle of up to 60 degrees. Further, in the case of a metal 0.1 to 0.3 mm thick, the width of the part of this slope will reach 0.05 to 0.15 mm. Therefore, as shown in FIG. 22, in the case of laminating the IC module 12 with the over sheet 32, a gap will be made between the sides of the external contact terminal, the over sheet 32 will overlap on the above mentioned slope and the surface of the over sheet 32 will not be flush with the surface of the external contact terminal. Thus, the lamination with the over sheet 32 will be impossible. over sheet 32 will be impossible.

SUMMARY OF THE INVENTION

It is an object of the present invention to provide a printed wiring board for IC cards wherein the external contact terminals of the kind necessary and indispensable to IC cards are superior in the electric contact with a read-writer for IC cards, in reliability and in bending resistance.

The present invention relates to a printed wiring board 10 for IC cards which is built in or fitted to an IC card 30. The IC card 30 to which the printed wiring board 10 for IC cards according to the present invention is to be applied has external contact terminals and is of a so-called laminated type wherein, in joining the IC module in which the IC chip 11 is built with the sheet-shaped card material 31, the sheet-shaped card material 31 is laminated on both front and back surfaces with the over sheets 32 to protect the above mentioned IC module 12.

The present invention is a printed wiring board 10 for IC cards built in or fitted to a part of the IC card 30 having external contact terminals, characterized in that bumps 20 formed of an electroconductive material are provided by such method as of plating, bonding or fitting on the conductor circuit 13 of the printed wiring board 10 for IC cards and on the surfaces of the parts corresponding to the above mentioned external contact terminals and are made the external contact terminals high in the dimensional precision.

The present invention is a printed wiring board 10 for IC cards wherein each bump 20 is formed of an electroconductive material separately from the 13 on the surface of the conductor circuit printed wiring board 10 for IC cards to be applied to the IC card 30 of this kind. The bump 20 is made an external contact terminal so that the external contact terminal consisting of the bump 20 may be on the same plane level as the plastic surface which is the surface of the IC card, that is, the over sheet 32 surface and only the contact surface of the external contact terminal may be exposed on the surface of the IC card 30.

By forming the printed wiring board 10 for IC cards as described, the the over sheet 32 of sufficient thickness to prevent the IC module built in or fitted to the printed wiring board from springing out can be used and, even in case the IC card 30 is bent, the bump 20 which is the external contact terminal will not make a recess on the IC card 30 surface. Therefore the reliability of the electric contact of the bump 20 which is the external contact terminal will be high.

BRIEF DESCRIPTION OF THE DRAWINGS

FIGS. 8 to 11 are vertically sectioned views showing the order of forming a printed wiring board for IC cards according to the present invention.

FIGS. 12 to 14 are respectively vertically sectioned views showing that a bump to be an external contact terminal is formed by bonding.

FIGS. 15 to 17 are vertically sectioned views showing that a bump to be an external contact terminal is formed by fitting.

FIG. 18 to 20 are partly magnified vertically sectioned views showing conventional IC cards.

DESCRIPTION OF THE PREFERRED EMBODIMENT

The present invention shall be described in detail in the following with reference to the respective embodiments shown in the drawings.

Figure 1:
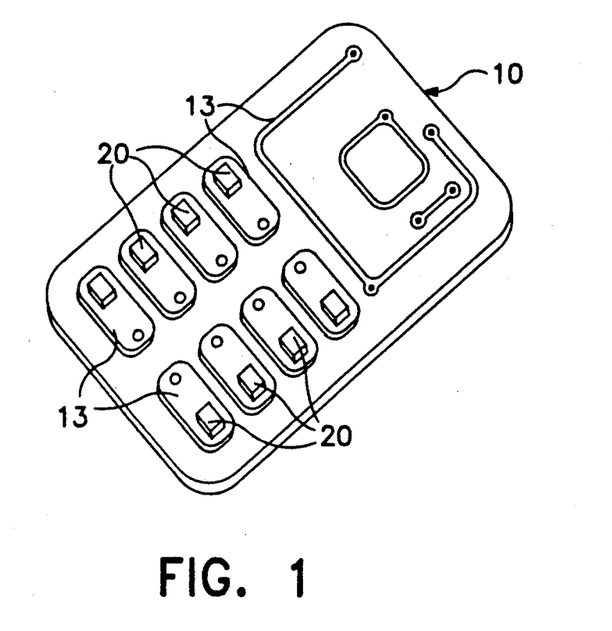
FIGS. 1 and 2 are perspective views showing respective embodiments of the printed wiring board for IC cards according to the present invention.
Figure 2:
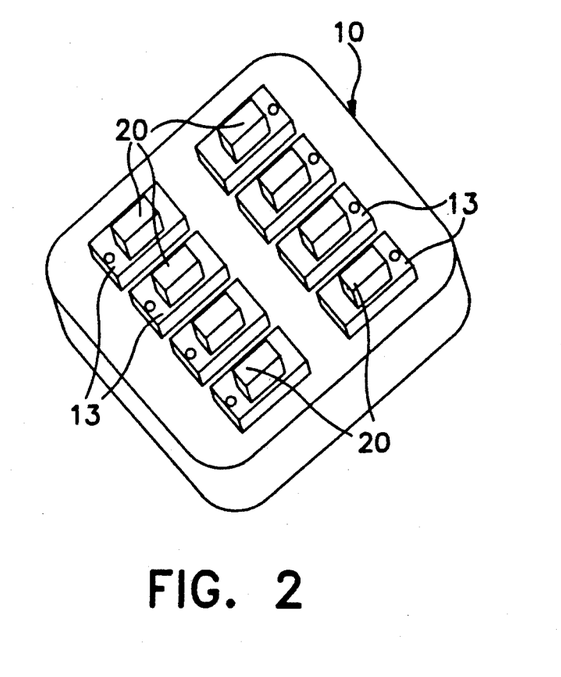
Figure 3:
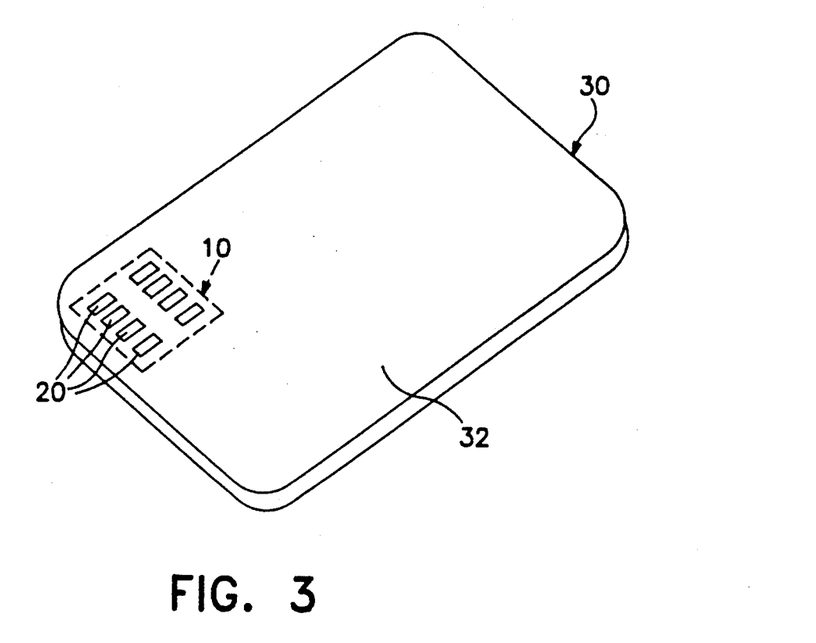
FIG. 3 is a perspective view of an IC card in which the printed wiring board for IC cards shown in FIG. 1 or 2 is built.

FIGS. 1 and 2 are perspective views showing a printed wiring board 10 for IC cards according to the present invention.

Figure 5:
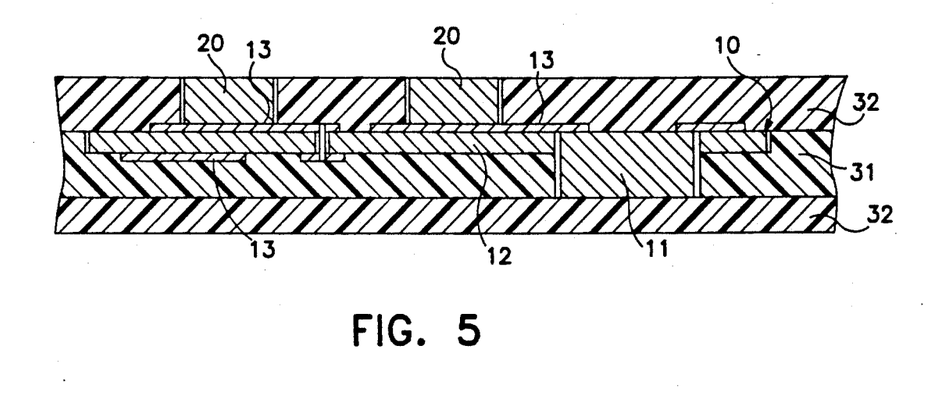
FIG. 5 is a view showing an IC card formed by using the printed wiring board for IC cards according to the present invention and is a partly magnified vertically sectioned view in the case of using a printed wiring board for IC cards in which IC chips are built.

As shown in FIG. 5, the printed wiring board 10 for IC cards shown in FIG. 1 is fitted with such electronic parts as IC chips 11 so as to be an IC module 12.

In such printed wiring board 10 for IC cards, bumps 20 of any thickness formed of an electroconductive material are provided on the surface of a part of a conductor circuit 13 formed on the surface of the IC module 12. In the printed wiring board 10 for IC cards shown in FIG. 1, the IC module 12 is made by fitting such electronic part as the IC chip 11 on the surface and therefore can be easily made thin, a thicker over sheet 32 can be used in making an IC card 30 and therefore the reliability in case the IC card 30 is bent can be improved.

Figure 6:
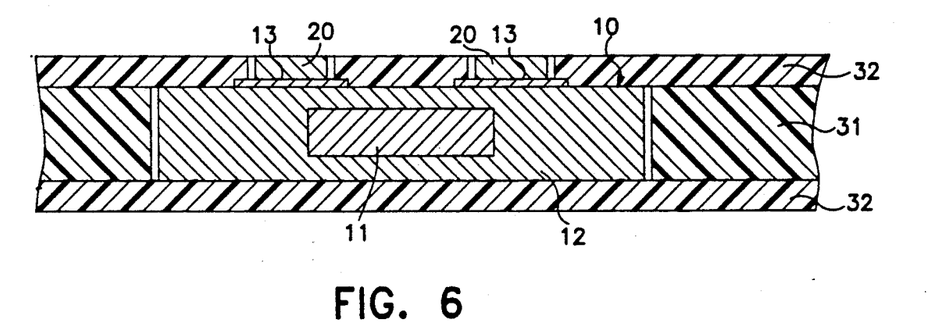
FIG. 6 is a view corresponding to FIG. 5 and showing an IC card formed by using the printed wiring board for IC cards according to the present invention and is a partly magnified vertically sectioned view in the case of using a printed wiring board for IC cards to which IC chips are fitted.

Alternatively, in the printed wiring board 10 for IC cards shown in FIG. 2, as shown in FIG. 6, the IC module 12 is made by building therein such electronic part as the IC chip 11. In such printed wiring board 10 for IC cards, bumps 20 of any thickness formed of an electroconductive material are provided on the surface of a part of the conductor circuit 13 formed on the surface of the IC module 12. In the printed wiring board 10 for IC cards shown in FIG. 2, the IC chip 11 enters the printed wiring board 10, the back surface of the IC module becomes flat and therefore there is an advantage that, in case the IC card 30 is made by using this printed wiring board 10 for IC cards, it will be easy to work the sheet-shaped card material to make a card.

For purposes of the present invention, the term "bump" means a part projected from a fixed surface and of a material different from the material forming the surface.

Also, any thickness mentioned above means that the thickness of the bump 20 to be the external contact terminal when the IC module 12 is fitted to the IC card 30 is such that, as shown in FIGS. 5 and 6, the surface of the bump 20 may be at least on the same plane level as the surface of the over sheet 32. As regards the thickness of this bump 20, as described above, it is reported from the bending standard test in the interim report "ISO/TC 97/SU 17 Identification and Credit Cards", June, 1984 that, in order to prevent the IC module 12 from springing out when the IC card 30 is bent, in the case of using the over sheet 32 made, for example, of vinyl chloride, the thickness of the over sheet 32 will be required to be at least 0.1 mm. or, if possible, more than 0.15 mm. Therefore, the thickness of the bump 20 to be the external contact terminal is required to be at least 0.1 mm.

The thickness of the bump 20 is such that the surface of the bump 20 may be at least on the same plane level as the surface of the over sheet 32. Therefore, in order that the bump 20 may electrically contact a read-writer for IC cards, the surface of the bump 20 is required to be flush with or project from the surface of the over sheet 32 or to be preferably the same as of the over sheet 32.

The bump 20 may be formed of such electroconductive material as, for example, preferably copper or nickel or its alloy. Further, in order to secure the conductivity and abrasion-resistance of the bump 20, it is preferable to form the contact surface of the bump of gold, platinum, silver, palladium, iridium, osmium, tungsten, copper, chromium, nickel or carbon or its alloy.

By the formation as in the above, with the bump 20 having a flat contact surface and a thickness of about 0.1 to 0.3 mm, when the printed wiring board 10 for IC cards according to the present invention to be the IC module 12 is fitted to the IC card 30, the surface of the bump 20 to be the external contact terminal will be flush with the surface of the over sheet and only the contact surface of the bump 20 will be exposed on the surface of the IC card 30.

Figure 7:
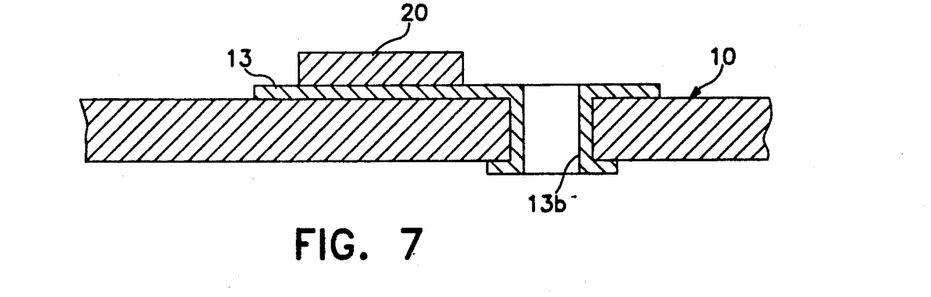
FIG. 7 is a partly magnified vertically sectioned view showing the vicinity of each of the external contact terminals shown in FIGS. 5 and 6.

Further, in the printed wiring board 10 for IC cards according to the present invention, particularly as shown in FIG. 7, the bump 20 is formed separately from the conductor circuit 13 formed on the surface of the IC module 12. In other words, this bump 20 is formed on the conductor circuit 13 of the printed wiring board 10 for IC cards and on the surface of the part corresponding to the external contact terminal. Therefore, it is possible to form a through hole 13b, as is shown in FIG. 7, in the part of the conductor circuit 13 laminated with the over sheet 32 and also make the conductor circuit 13 as thin as possible. When the conductor circuit 13 is laminated with the over sheet 32, even if the over sheet 32 is thick, the limitation of the thickness of the IC card of this kind will be able to be cleared.

The method of producing the printed wiring board 10 for IC cards according to the present invention shall be explained in the following. The following methods of forming the bumps 20 forming the printed wiring board 10 for IC cards are illustrative but the present invention is not limited to use of these methods:

1. The method of forming the bumps 20 by plating.
2. The method of forming the bumps 20 by bonding the separately formed contact terminal parts 21 to predetermined positions of the wiring board.
3. The method of forming the bumps 20 by fitting the separately formed contact terminal parts 21 to predetermined positions of the wiring board.

These three methods are practically excellent as methods of forming the bumps 20 high in the dimentional precision and shall be explained in detail in the following.

Figure 8:
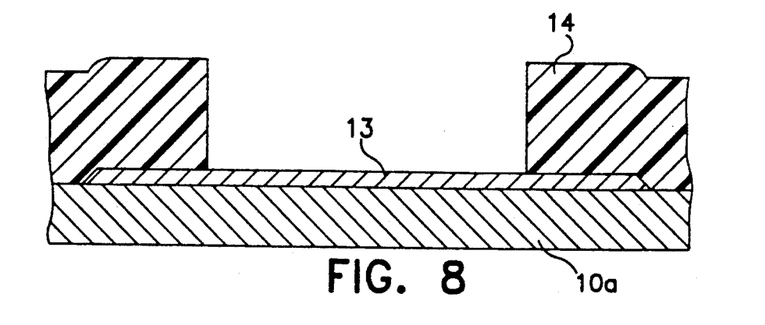
FIG. 8 is a partly magnified vertically sectioned view showing that a planting mask is arranged for the conductor circuit on the IC modules.
Figure 9:
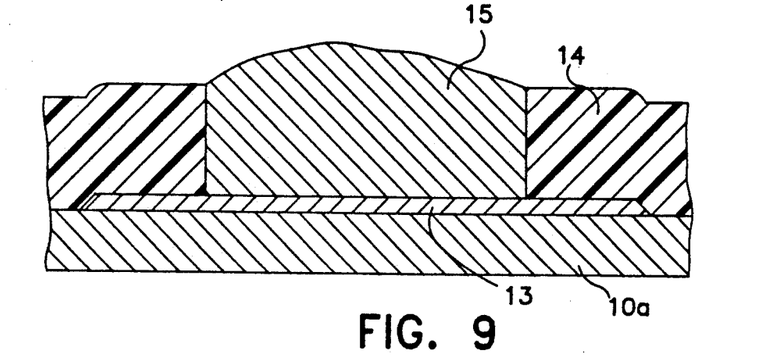
FIG. 9 is a partly magnified vertically sectioned view showing that a predetermined plating to be a bump is applied on the conductor circuit.

As the method of forming the bumps 20 by plating is taken such method as shown in FIGS. 8 to 11. First of all, a plating mask 14 having windows each corresponding to the size of the required bump 20 is formed in advance and is pasted to the required part of the conductor circuit 13 as shown in FIG. 8. As shown in FIG. 9, a plating 15 can be formed by applying a non-electrolytic or electrolytic plating to the conductor circuit 13 exposed from each window of the plating mask 14. The plating mask 14 used here is made of such plastic film as of a polyester, vinyl chloride or polypropylene with an adhesive, is made to correspond to predetermined positions of the conductor circuit 13 in which the bumps 20 to be the external contact terminals are to be provided and is punched only in the external contact terminal parts with a die or the like to form windows. Alternatively a photosensitive resist film or ink used to produce ordinary printed wiring boards is made to be of a required thickness for the plating mask 14 and is used as adapted to a plating bath.

When the bump 20 is comparatively thin, a non-electrolytic plating will be preferable and, in case the bump 20 is thick, an electrolytic plating will be preferable. The preferred plating is metal copper or nickel. A preferred electrolytic plating method includes a plating solution jetted onto a part to be partly plated while a predetermined part of the plating mask 14 is covered with such automatically mechanically fitted elastic film as of rubber. This method is so effective because a required plating thickness can be obtained within a short time and the fluctuation of the thickness is little.

When the thus formed plating 15 is treated on the surface, the contact surface of the bump 20 formed of this plating 15 will be surface treated to be plane. Typical surface treating methods to be used are chemical polishing, electrolytic polishing, and physical grinding.

Figure 10:
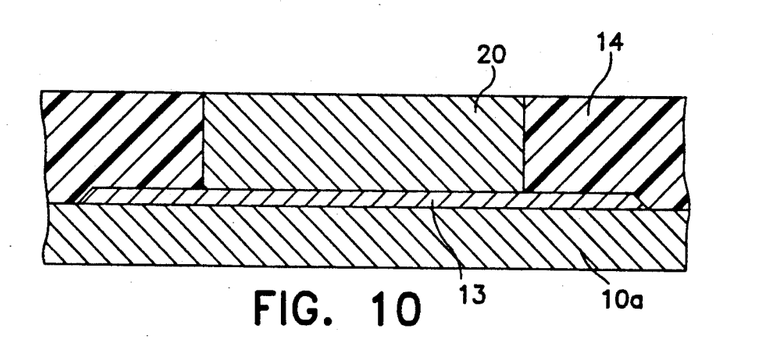
FIG. 10 is a partly magnified vertically sectioned view showing that a plated part is ground with a plating mask arranged as it is.
Figure 11:
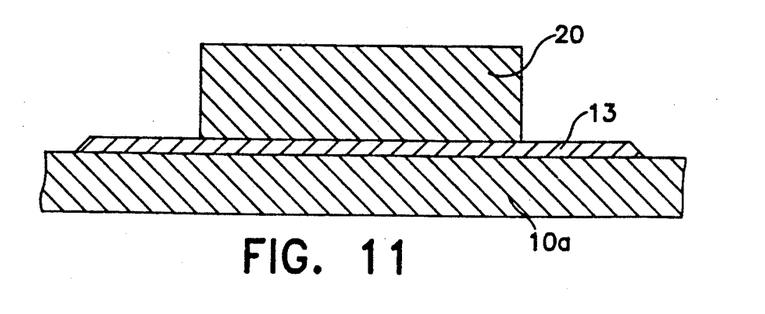
FIG. 11 is a partly magnified vertically sectioned view showing that a plating mask is removed to expose a bump.

Particularly, as shown in FIG. 10, when the plating 15 obtained as in the above is physically surface-ground with a buff, sander or the like only on the upper surface while the plating mask 14 is formed as it is, the smoothness of the plating mask 14 itself will be able to be utilized, the fluctuation of the plating thickness will be able to be eliminated and the grinding flaws will be able to be eliminated. By taking such method, a bump 20 very smooth on the plated surface, high in the plane precision and very high in the position precision can be obtained.

Now, a method of forming by bonding or fitting the bumps 20 forming the printed wiring board 10 for IC cards shall be explained in the following.

In the case of forming the bump 20 by bonding or fitting the contact terminal part 21 to be the bump 20 in the predetermined position on the printed wiring board 10a, the method of shaping the contact terminal part 21 will not be limited at all. For example, in case the contact terminal part 21 is formed by a press shaping method, the material will not be limited. Particularly, in case a material high in the punching workability is to be used, an Fe-Ni type or Cu type material will do. In case this contact terminal part 21 is formed by an injection molding method, such metal as of an aluminum or magnesium alloy die cast type comparatively low in the working temperature will do. Also, the external contact terminal part may be injection-molded of such thermoplastic resin as ABS and then non-electrolytically or electrolytically plated to provide an electroconductive layer.

Figure 12:
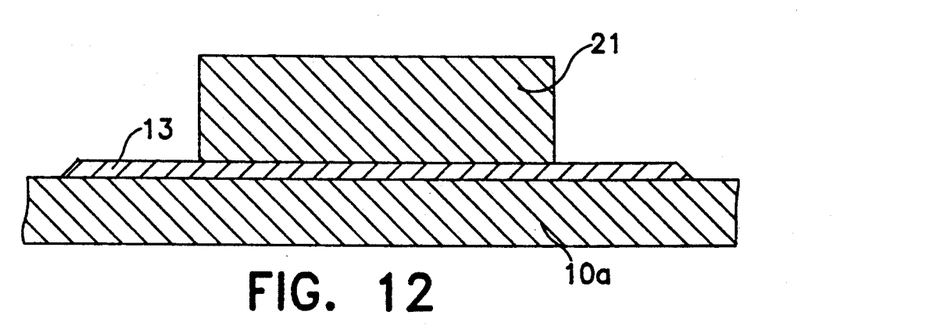
FIG. 12 is a partly magnified vertically sectioned view showing that a bump is bonded directly onto a conductor circuit.
Figure 13:
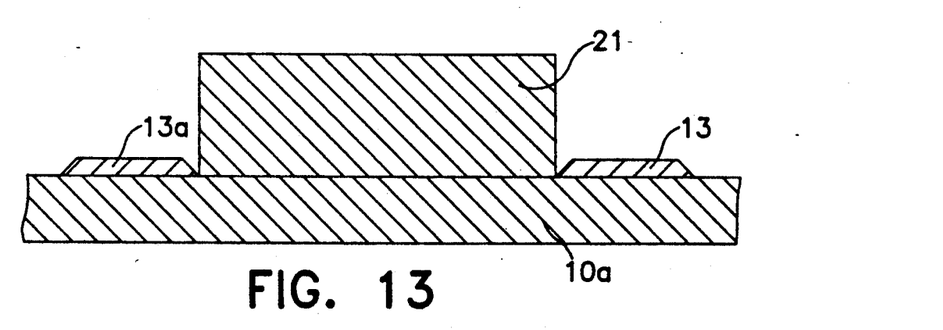
FIG. 13 is a partly magnified vertically sectioned view showing that a bump is fitted and bonded into a recess in a conductor circuit.
Figure 14:
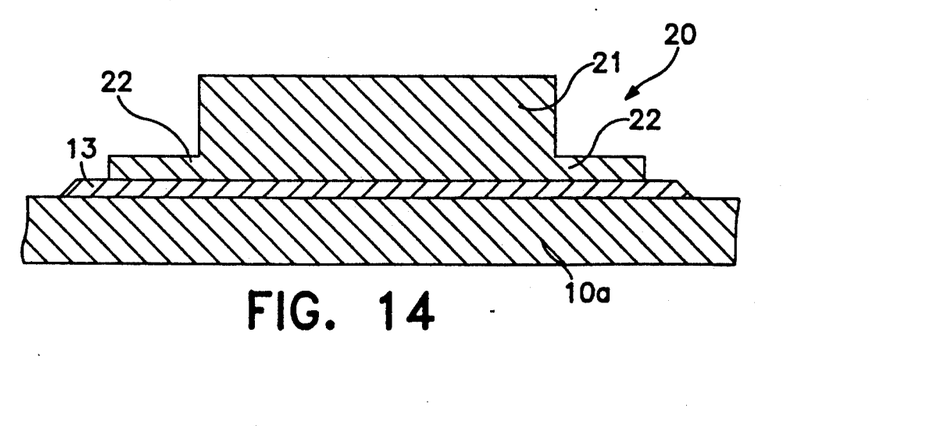
FIG. 14 is a partly magnified vertically sectioned view showing that a flanged bump is bonded onto a conductor circuit.

The method of fixing the contact terminal part 21 to the IC module 12 side is not limited at all. For example, bonding fixing methods are shown in FIGS. 12 to 14. FIG. 12 shows a method of bonding the contact terminal part 21 directly on the surface of a predetermined part of the conductor circuit 13. FIG. 13 shows a method of bonding and fixing the contact terminal part 21 in a recess 13a formed in a predetermined position of the conductor circuit 13. In the method shown in FIG. 13, a pattern for positioning the contact terminal parts 21 can be provided in advance on the printed wiring board 10a. Therefore, it is particularly preferable. Further, the bump 20 shown in FIG. 14 is of a type having a flange 22 below the contact terminal part 21 shown in FIG. 12. In case the printed wiring board 10 for IC cards according to the present invention is fitted to the IC card 30 and is laminated with the over sheet 32, the flange 22 will be laminated with this over sheet 32 and will be fixed and therefore the bonding reliability of the bump 20 will be high.

The bonding agent for bonding the thus formed contact terminal parts 21 to the IC module 12 side is not limited at all. An organic or inorganic liquid bonding agent or a bonding film may be used. Such molten metal as a solder may be also used. In the case of bonding fixing with a non-electroconductive substance, treatment with a non-electrolytic plating or the like after fixing will ensure conductivity.

Figure 15:
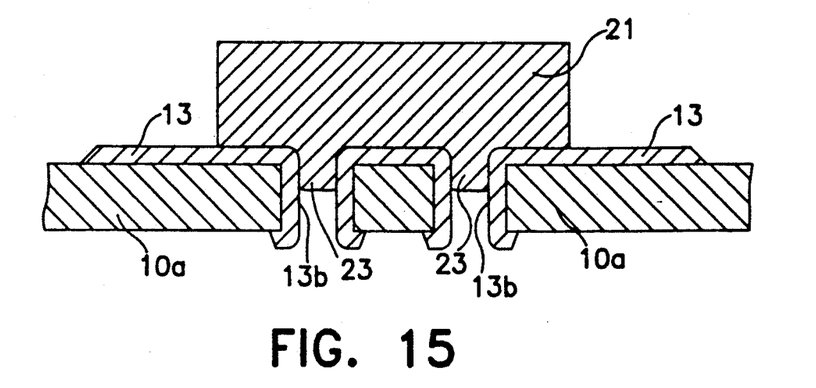
FIG. 15 is a partly magnified vertically sectioned view showing that projections formed on the lower surface of a bump are fitted into respective through holes.
Figure 16:
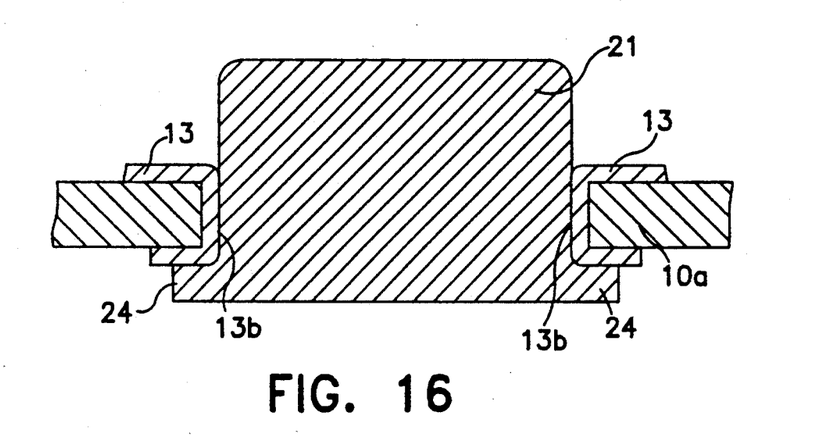
FIG. 16 is a partly magnified vertically sectioned view showing that a bump is fitted into a predetermined hole and is supported by a flange part formed on the bump.
Figure 17:
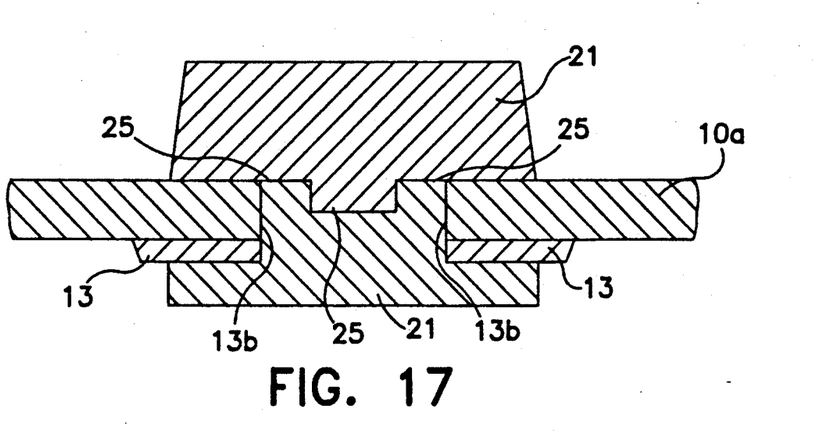
FIG. 17 is a partly magnified vertically sectioned view showing that a metal to be a bump is divided into two upper and lower parts which are fitted from above and below.

In the case of fitting fixing the contact terminal parts 21, the methods shown in FIGS. 15 to 17 will be considered. FIG. 15 shows a method of positioning and fixing the contact terminal parts 21 by providing projections 23 on the fitting surface side of the contact terminal part 21 and fitting these projections 23 into respective holes 13b made in advance in the printed wiring board 10a. In FIG. 16, the contact terminal part 21 is provided with a flange-shaped part 24 on the entire periphery of the lower surface and is positioned and fixed from below in a hole 13b made in advance in the printed wiring board 10a. In FIG. 17, both contact terminal parts 21 made separately above and below have fitting projections 25 formed and are inserted from above and below into a hole 13b made in advance in the printed wiring board 10a so that the respective fitting projections 25 may be fitted with each other to position and fix both contact terminal parts 21. In such case, it will be preferable to bond and fix the respective contact terminal parts after fitting.

EXAMPLE 1

This example is to form the bump 20 by plating.

A glass epoxy copper foil laminate (copper thickness of 18 $\mu$m on both surfaces) was drilled with a NC drill and then a required wiring pattern (conductor circuit 13) was formed of the laminate by an ordinary subtractive method. In order to form the bumps 20 by the electrolytic plating after the pattern was formed, four sheets of Laminar TA 2 mils thick produced by Dynachem Co. were overlapped and laminated as a plating mask 14. Then, by using the mask required to form the bumps 20, the pattern was exposed with 300 mj/cm$^2$. with a 201B type exposing machine manufactured by Oak Co. and was then developed by using an aqueous solution of 2% sodium carbonate. Then, the plated part of the contact terminal part was exposed, was pretreated as required for plating and was plated for about 3.5 hours with a current density of 4 A./dm$^2$. by using a copper sulfate plating solution to form a plating 15.

This plating 15 was set in the thickness with a belt sander (manufactured by Kikukawa Iron Works Co., Sander No. 600) and was wet-ground. Then, the plating mask 14 was removed off with methylene chloride. Further, the conductor circuit 13 and bump 20 were respectively nickel-plated and gold-plated to thereby form the bump 20 thicker by 150±20 $\mu$m than the conductor of the conductor circuit 13, having an area of (2.5±0.025) mm.×(1.9±0.025) mm and smooth on the surface. The printed wiring board 10 for IC cards having the bumps 20 were as shown in FIG. 2.

When a vinyl chloride sheet (over sheet 32) of a thickness of 3 mils provided with windows punched with a die in the positions corresponding to the respective bumps 20 of the printed wiring board 10 for IC cards was overlapped on the printed wiring board 10 and was heat-pressed for 2 minutes at a temperature of 95° C., they could be joined so that there might be no gap between the over sheet 32 and bump 20 and the surfaces of the over sheet 32 and bump 20 might be on the same plane level.

EXAMPLE 2

This example is to form the bump 20 by plating.

A printed wiring pattern was formed the same as in the above mentioned Example 1 and a polyester film of a thickness of 200 μm fitted with an adhesive on one surface was punched with a die to form holes corresponding to the size of the bumps 20. Then, this film was positioned on the printed wiring board 10a and was bonded under pressure. The printed wiring board 10a was electrolytically plated by a thickness of 180 μm by using an electrolytic Ni plating solution (sulfamic acid bath) to form a plating 15. At this time, the current density was 10 A./dm$^2$. and the time was 100 minutes.

This plating 15 was wet-ground with Tsunoda Brush P No. 600. When the above mentioned polyester film was peeled off and the thickness of the bump 20 was measured, there was obtained the bump 20 thicker by 130±20 μm than the other conductor wiring and having a smooth plane.

EXAMPLE 3

This example is to form the bump 20 by bonding.

A glass epoxy copper foil laminate (copper thickness of 18 μm on both surfaces) was holed with a NC drill and then a required wiring pattern was formed of the laminate by an ordinary subtractive method. At this time, the contact terminal part 21 fixing parts had the copper removed so as to conform to the shape (2.1±0.05 mm × 1.8±0.05 mm.) of the part 21.

Then, one surface of a phosphor bronze plate roll (50 mm. wide and 0.2 mm. thick) was made rough by blast-grinding and the other surface was mirror-ground by buff-grinding. Here, the rough surface was coated with an electroconductive ink (E-Kote 3080 produced by Acme Chemicals Co.) by a thickness of 0.01 to 0.1 mm with a roll coater and was heated at a temperature of 95° C. for 20 minutes to be tack-free. In this state, the phosphor bronze plate roll was punched to make chips (of 2.1±0.05 mm × 1.8±0.05 mm) with a press.

These chips (which were the contact terminal parts 21 and were later the bumps 20) were arranged with the coated surfaces on the printed wiring board 10a side in the fixed places of the printed wiring board 10a after the above mentioned pattern was formed. A jig plate (stainless steel plate 0.2 mm thick) having had escape holes made only in the fixed places was placed on the chips and was heat-pressed under the pressing conditions (of a pressing pressure of 400 kgf/cm$^2$ and temperatures of 90° C. for 20 min., 120° C. for 20 min. and 150° C. for 20 min.) to obtain the printed wiring board 10 for IC cards according to the present invention having the bumps 20 of such cross section as shown in FIG. 12.

In evaluating this printed wiring board 10 for IC cards, it was found that the height of the bump 20 from the base was 0.21±0.01 mm, the surface of the bump 20 was smooth and the conduction resistance between the conductor circuit 13 on the printed wiring board 10 for IC cards and the bump 20 was 0.03.

EXAMPLE 4

This example is to form the bump 20 by fitting.

The contact terminal part 21 having the shape (2.6±0.05 mm × 1.9±0.05 mm × height 0.2±0.05 mm) shown in FIG. 15 and having two columnar projections (diameter 0.4±0.05 mm × height 0.1±0.04 mm) provided on the back surface was made of a magnesium alloy die casting (material: AZ91A).

Figure 4:
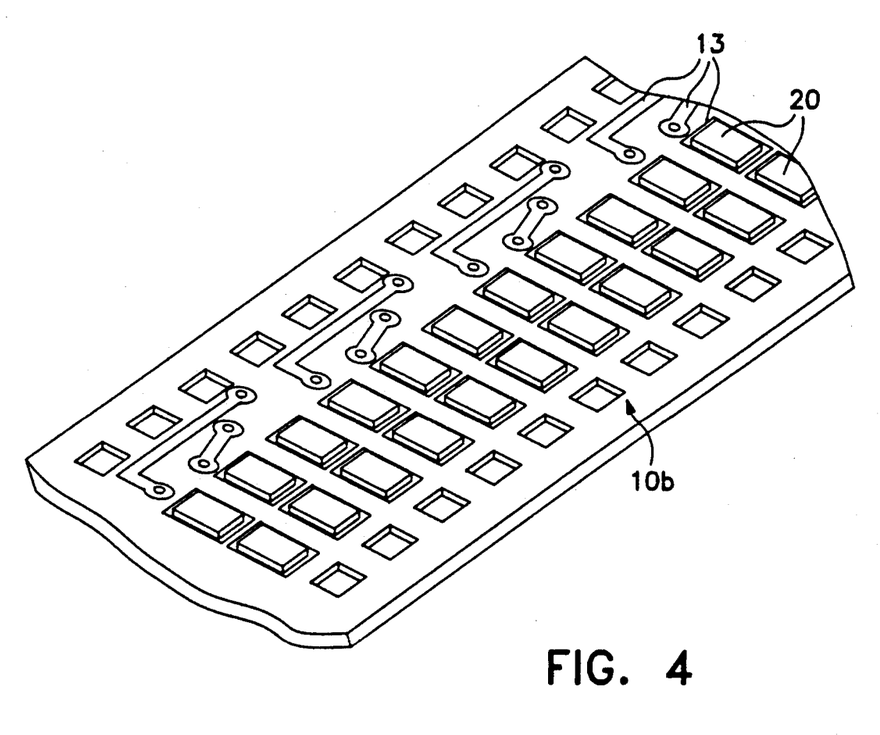
FIG. 4 is a partial perspective view showing a plurality of printed wiring boards for IC cards formed continuously to be in the form of a long band.

Fitting holes (of a diameter of 0.45±0.05 mm) conforming to the projections of these parts 21 were made in the base to be the printed wiring board 10b and were plated through the holes to make such long continuous band-shaped flexible printed wiring board 10b after the formation of the pattern as shown in FIG. 4. This printed wiring board 10b has sprocket holes on both sides. By these, the long band-shaped printed wiring board 10b was conveyed by an air feeder, was positioned by positioning pins in the sprocket holes and was sucked and fixed.

The contact terminal parts aligned by a vibration part feeder were fitted in the above mentioned fitting holes of the printed wiring board 10b by a NC-controlled manipulator. The fitted state was confirmed by a displacement sensor. By repeating the above operations, the contact terminal parts 21 to be the bumps 20 could be continuously fitted in the predetermined positions for the long band-shaped printed wiring board 10b.

The printed wiring board 10 for IC cards according to the present invention formed as in the above is to be built in or fitted to a part of an IC card.

This printed wiring board 10 for IC cards is used in IC cards for such various uses as for cashing cards, credit cards, identification cards, medical cards and telephone cards.

What is claimed is:

1. A method for producing a printed wiring board for an IC card, wherein said printed wiring board has a substrate of a non-conductive material, a printed wiring pattern on said substrate, and bumps on said printed wiring pattern, comprising:

forming a plating mask on said printed wiring pattern and said substrate, said plating mask having windows, each window corresponding to the size and location of each said bump which is to be plated to a predetermined part of said printed wiring pattern;

plating an electroconductive material to said printed wiring pattern exposed by each said window of said plating mask to form platings having a top surface;

with the plating mash in place over said printed wiring pattern and said substrate, surface treating only the top surface of the platings in order to form said bumps;

removing said plating mask to expose said bumps; and surrounding said bumps and covering said printed wiring pattern and said substrate with an over sheet of a non-conductive material.

2. A method of producing a printed wiring board for an IC card according to claim 1, wherein the flat top surface of each said bump is formed such that the flat top surface of each said bump is coplanar with the flat upper surface of the over sheet of the IC card.

3. A method of producing a printed wiring board for an IC card according to claim 1 wherein only the flat top surface, being a contact surface, of each said bump is exposed on the surface of the IC card.

4. A method for producing a printed wiring board for an IC card according to claim 1 wherein each said bump formed on a conductor circuit of said printed wiring board forms an external contact terminal to a surface on a corresponding part.

5. A method for producing a printed wiring board for an IC card according to claim 1 wherein said plating mask is a photosensitive resist film.

6. A method for producing a printed wiring board for an IC card according to claim 1 wherein said plating mask is a plastic film with an adhesive.

7. A method for producing a printed wiring board for an IC card according to claim 6 wherein said surface treatment is a physical surface grinding.

8. A method for producing a printed wiring board for an IC card according to claim 7 wherein said physical surface grinding is a sander-grinding.

9. A method for producing a printed wiring board for an IC card according to claim 7 wherein said physical surface grinding is a buff-grinding.

* * * * *

UNITED STATES PATENT AND TRADEMARK OFFICE
CERTIFICATE OF CORRECTION

PATENT NO. : 5,203,078

DATED : April 20, 1993

INVENTOR(S) : Chiaki Nakanishi: Atsushi Hiroi; Yoji Yanagawa

It is certified that error appears in the above-indentified patent and that said Letters Patent is hereby corrected as shown below:

On the Title page:

In the Title, before "PRINTED" insert --METHOD OF PRODUCING A--.

Column 1, Line 2, before "PRINTED" insert --METHOD OF PRODUCING A--; and

Column 1, Line 22, after "type" insert --device--; and

Column 1, Line 39, insert --,-- after "convenience"; and

Column 3, Line 4, after "out" insert --in case-- and after "bent," delete "in case "; and Column 5, Line 8, delete "over sheet 32 will be impossible."; and Column 5, Line 41, after "from the" insert --conductor circuit--; and Column 5, Line 42, after "of the" delete "conductor circuit"; and Column 5, Line 52, delete the first "the"; and Column 7, Line 57, before "17" delete "97/SU" and insert --97/SC--; and

UNITED STATES PATENT AND TRADEMARK OFFICE
CERTIFICATE OF CORRECTION

PATENT NO. : 5,203,078
DATED : April 20, 1993
INVENTOR(S) : Chiaki Nakanishi: Atsushi Hiroi; Yoji Yanagawa It is certified that error appears in the above-indentified patent and that said Letters Patent is hereby corrected as shown below:

Column 9, Line 9, after "plating" delete "is"
            after "metal" insert --is--; and Signed and Sealed this Twenty-ninth Day of March, 1994

Attest:

BRUCE LEHMAN

*Attesting Officer*      Commissioner of Patents and Trademarks